(12) United States Patent
Langhammer

(10) Patent No.: US 8,650,231 B1
(45) Date of Patent: *Feb. 11, 2014

(54) CONFIGURING FLOATING POINT OPERATIONS IN A PROGRAMMABLE DEVICE

(75) Inventor: Martin Langhammer, Alderbury (GB)

(73) Assignee: Altera Corporation, San Jose, CA (US)

(*) Notice: Subject to any disclaimer, the term of this patent is extended or adjusted under 35 U.S.C. 154(b) by 1113 days.

This patent is subject to a terminal disclaimer.

(21) Appl. No.: 12/625,800

(22) Filed: Nov. 25, 2009

Related U.S. Application Data

(63) Continuation-in-part of application No. 11/625,655, filed on Jan. 22, 2007, now Pat. No. 7,865,541.

(51) Int. Cl.
*G06F 7/00* (2006.01)

(52) U.S. Cl.
USPC ............ 708/204; 708/205; 708/206; 708/209

(58) Field of Classification Search
USPC ........................................................ 708/204
See application file for complete search history.

(56) References Cited

U.S. PATENT DOCUMENTS

| | | |
|---|---|---|
| 3,473,160 A | 10/1969 | Wahlstrom |
| 3,697,734 A | 10/1972 | Booth et al. |
| 3,800,130 A | 3/1974 | Martinson et al. |
| 4,156,927 A | 5/1979 | McElroy et al. |
| 4,179,746 A | 12/1979 | Tubbs |
| 4,212,076 A | 7/1980 | Conners |
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,575,812 A | 3/1986 | Kloker et al. |
| 4,597,053 A | 6/1986 | Chamberlin |
| 4,616,330 A | 10/1986 | Betz |

(Continued)

FOREIGN PATENT DOCUMENTS

| | | |
|---|---|---|
| EP | 0 158 430 | 10/1985 |
| EP | 0 380 456 | 8/1990 |

(Continued)

OTHER PUBLICATIONS

Altera Corporation, "FIR Compiler: MegaCore® Function User Guide," version 3.3.0, rev. 1, pp. 3 11 through 3 15 (Oct. 2005).

(Continued)

*Primary Examiner* — Henry Tsai
*Assistant Examiner* — Dean Phan
(74) *Attorney, Agent, or Firm* — Ropes & Gray LLP; Jeffrey H. Ingerman

(57) ABSTRACT

A programmable device is programmed to perform arithmetic operations in an internal format that, unlike known standard formats that store numbers in normalized form and require normalization after each computational step, stores numbers in unnormalized form and does not require normalization after each step. Numbers are converted into unnormalized form at the beginning of an operation and converted back to normalized form at the end of the operation. If necessary to avoid data loss, a number may be normalized after an intermediate step. To conserve resources, rather than configuring the every intermediate operation to have the same mantissa size, in the internal format the mantissa size may start out smaller and grow after each operation.

23 Claims, 9 Drawing Sheets

(56) References Cited

U.S. PATENT DOCUMENTS

| | | |
|---|---|---|
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,736,335 A | 4/1988 | Barkan |
| 4,754,421 A | 6/1988 | Bosshart |
| 4,791,590 A | 12/1988 | Ku et al. |
| 4,799,004 A | 1/1989 | Mori |
| 4,823,260 A | 4/1989 | Imel et al. |
| 4,823,295 A | 4/1989 | Mader |
| 4,839,847 A | 6/1989 | Laprade |
| 4,871,930 A | 10/1989 | Wong et al. |
| 4,893,268 A | 1/1990 | Denman et al. |
| 4,908,788 A | 3/1990 | Fujiyama |
| 4,912,345 A | 3/1990 | Steele et al. |
| 4,918,637 A | 4/1990 | Morton |
| 4,967,160 A | 10/1990 | Quievy et al. |
| 4,982,354 A | 1/1991 | Takeuchi et al. |
| 4,991,010 A | 2/1991 | Hailey et al. |
| 4,994,997 A | 2/1991 | Martin et al. |
| 4,999,803 A | 3/1991 | Turrini et al. |
| 5,073,863 A | 12/1991 | Zhang |
| 5,081,604 A | 1/1992 | Tanaka |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| 5,267,187 A | 11/1993 | Hsieh et al. |
| 5,296,759 A | 3/1994 | Sutherland et al. |
| 5,338,983 A | 8/1994 | Agarwala |
| 5,339,263 A | 8/1994 | White |
| 5,349,250 A | 9/1994 | New |
| 5,357,152 A | 10/1994 | Jennings, III et al. |
| 5,371,422 A | 12/1994 | Patel et al. |
| 5,373,461 A | 12/1994 | Bearden et al. |
| 5,375,079 A | 12/1994 | Uramoto et al. |
| 5,381,357 A | 1/1995 | Wedgwood et al. |
| 5,404,324 A | 4/1995 | Colon-Bonet |
| 5,424,589 A | 6/1995 | Dobbelaere et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,812 A | 3/1996 | Saishi et al. |
| 5,500,828 A | 3/1996 | Doddington et al. |
| 5,523,963 A | 6/1996 | Hsieh et al. |
| 5,528,550 A | 6/1996 | Pawate et al. |
| 5,537,601 A | 7/1996 | Kimura et al. |
| 5,541,864 A | 7/1996 | Van Bavel et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,631,848 A | 5/1997 | Laczko et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,519 A | 7/1997 | Yatim et al. |
| 5,644,522 A | 7/1997 | Moyse et al. |
| 5,646,545 A | 7/1997 | Trimberger et al. |
| 5,646,875 A | 7/1997 | Taborn et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,754,459 A | 5/1998 | Telikepalli |
| 5,761,483 A | 6/1998 | Trimberger |
| 5,764,555 A | 6/1998 | McPherson et al. |
| 5,768,613 A | 6/1998 | Asghar |
| 5,771,186 A | 6/1998 | Kodali et al. |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,808,926 A | 9/1998 | Gorshtein et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,847,978 A | 12/1998 | Ogura et al. |
| 5,847,981 A | 12/1998 | Kelley et al. |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,892,962 A | 4/1999 | Cloutier |
| 5,894,228 A | 4/1999 | Reddy et al. |
| 5,898,602 A | 4/1999 | Rothman et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,018,755 A | 1/2000 | Gonikberg et al. |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,339 A | 3/2000 | Yu et al. |
| 6,041,340 A | 3/2000 | Mintzer |
| 6,052,327 A | 4/2000 | Reddy et al. |
| 6,052,755 A | 4/2000 | Terrill et al. |
| 6,052,773 A | 4/2000 | DeHon et al. |

(56) References Cited

U.S. PATENT DOCUMENTS

| | | |
|---|---|---|
| 6,055,555 A | 4/2000 | Boswell et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |
| 6,075,381 A | 6/2000 | LaBerge |
| 6,084,429 A | 7/2000 | Trimberger |
| 6,085,317 A | 7/2000 | Smith |
| 6,091,261 A | 7/2000 | De Lange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,108,772 A | 8/2000 | Sharangpani |
| 6,130,554 A | 10/2000 | Kolze et al. |
| 6,140,839 A | 10/2000 | Kaviani et al. |
| 6,144,980 A | 11/2000 | Oberman |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,260,053 B1 | 7/2001 | Maulik et al. |
| 6,279,021 B1 | 8/2001 | Takano et al. |
| 6,286,024 B1 | 9/2001 | Yano et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,327,605 B2 | 12/2001 | Arakawa et al. |
| 6,346,824 B1 | 2/2002 | New |
| 6,351,142 B1 | 2/2002 | Abbott |
| 6,353,843 B1 | 3/2002 | Chehrazi et al. |
| 6,359,468 B1 | 3/2002 | Park et al. |
| 6,360,240 B1 | 3/2002 | Takano et al. |
| 6,362,650 B1 | 3/2002 | New et al. |
| 6,366,944 B1 | 4/2002 | Hossain et al. |
| 6,367,003 B1 | 4/2002 | Davis |
| 6,369,610 B1 | 4/2002 | Cheung et al. |
| 6,377,970 B1 | 4/2002 | Abdallah et al. |
| 6,407,576 B1 | 6/2002 | Ngai et al. |
| 6,407,694 B1 | 6/2002 | Cox et al. |
| 6,427,157 B1 | 7/2002 | Webb |
| 6,434,587 B1 | 8/2002 | Liao et al. |
| 6,438,569 B1 | 8/2002 | Abbott |
| 6,438,570 B1 | 8/2002 | Miller |
| 6,446,107 B1 | 9/2002 | Knowles |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,487,575 B1 | 11/2002 | Oberman |
| 6,523,055 B1 | 2/2003 | Yu et al. |
| 6,523,057 B1 | 2/2003 | Savo et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,578,060 B2 | 6/2003 | Chen et al. |
| 6,591,283 B1 | 7/2003 | Conway et al. |
| 6,591,357 B2 | 7/2003 | Mirsky |
| 6,600,495 B1 | 7/2003 | Boland et al. |
| 6,600,788 B1 | 7/2003 | Dick et al. |
| 6,628,140 B2 | 9/2003 | Langhammer et al. |
| 6,687,722 B1 | 2/2004 | Larsson et al. |
| 6,692,534 B1 | 2/2004 | Wang et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,732,134 B1 | 5/2004 | Rosenberg et al. |
| 6,744,278 B1 | 6/2004 | Liu et al. |
| 6,745,254 B2 | 6/2004 | Boggs et al. |
| 6,763,367 B2 | 7/2004 | Kwon et al. |
| 6,771,094 B1 | 8/2004 | Langhammer et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,801,924 B1 | 10/2004 | Green et al. |
| 6,836,839 B2 | 12/2004 | Master et al. |
| 6,874,079 B2 | 3/2005 | Hogenauer |
| 6,889,238 B2 | 5/2005 | Johnson |
| 6,904,471 B2 | 6/2005 | Boggs et al. |
| 6,915,322 B2 | 7/2005 | Hong |
| 6,924,663 B2 | 8/2005 | Masui et al. |
| 6,963,890 B2 | 11/2005 | Dutta et al. |
| 6,971,083 B1 | 11/2005 | Farrugia et al. |
| 6,978,287 B1 | 12/2005 | Langhammer |
| 6,983,300 B2 | 1/2006 | Ferroussat |
| 7,020,673 B2 | 3/2006 | Ozawa |
| 7,024,446 B2 | 4/2006 | Langhammer et al. |
| 7,047,272 B2 | 5/2006 | Giacalone et al. |
| 7,062,526 B1 | 6/2006 | Hoyle |
| 7,093,204 B2 | 8/2006 | Oktem et al. |
| 7,107,305 B2 | 9/2006 | Deng et al. |
| 7,113,969 B1 | 9/2006 | Green et al. |
| 7,181,484 B2 | 2/2007 | Stribaek et al. |
| 7,230,451 B1 | 6/2007 | Langhammer |
| 7,313,585 B2 | 12/2007 | Winterrowd |
| 7,343,388 B1 | 3/2008 | Burney et al. |
| 7,395,298 B2 | 7/2008 | Debes et al. |
| 7,401,109 B2 | 7/2008 | Koc et al. |
| 7,409,417 B2 | 8/2008 | Lou |
| 7,415,542 B2 | 8/2008 | Hennedy et al. |
| 7,421,465 B1 | 9/2008 | Rarick et al. |
| 7,428,565 B2 | 9/2008 | Fujimori |
| 7,428,566 B2 | 9/2008 | Siu et al. |
| 7,430,578 B2 | 9/2008 | Debes et al. |
| 7,430,656 B2 | 9/2008 | Sperber et al. |
| 7,447,310 B2 | 11/2008 | Koc et al. |
| 7,472,155 B2 | 12/2008 | Simkins et al. |
| 7,508,936 B2 | 3/2009 | Eberle et al. |
| 7,536,430 B2 | 5/2009 | Guevokian et al. |
| 7,567,997 B2 | 7/2009 | Simkins et al. |
| 7,590,676 B1 | 9/2009 | Langhammer |
| 7,646,430 B2 | 1/2010 | Brown Elliott et al. |
| 7,650,374 B1 | 1/2010 | Gura et al. |
| 7,668,896 B2 | 2/2010 | Lutz et al. |
| 7,719,446 B2 | 5/2010 | Rosenthal et al. |
| 7,720,898 B2 | 5/2010 | Driker et al. |
| 7,769,797 B2 | 8/2010 | Cho et al. |
| 7,814,136 B1 | 10/2010 | Verma et al. |
| 7,822,799 B1 | 10/2010 | Langhammer et al. |
| 7,917,567 B1 | 3/2011 | Mason et al. |
| 7,930,335 B2 | 4/2011 | Gura |
| 7,930,336 B2 | 4/2011 | Langhammer |
| 8,024,394 B2 | 9/2011 | Prokopenko |
| 8,090,758 B1 | 1/2012 | Shimanek et al. |
| 8,112,466 B2 | 2/2012 | Minz et al. |
| 2001/0023425 A1 | 9/2001 | Oberman et al. |
| 2001/0029515 A1 | 10/2001 | Mirsky |
| 2001/0037352 A1 | 11/2001 | Hong |
| 2002/0002573 A1 | 1/2002 | Landers et al. |
| 2002/0032713 A1 | 3/2002 | Jou et al. |
| 2002/0038324 A1 | 3/2002 | Page et al. |
| 2002/0049798 A1 | 4/2002 | Wang et al. |
| 2002/0078114 A1 | 6/2002 | Wang et al. |
| 2002/0089348 A1 | 7/2002 | Langhammer |
| 2002/0116434 A1 | 8/2002 | Nancekievill |

(56) References Cited

U.S. PATENT DOCUMENTS

| | | |
|---|---|---|
| 2003/0065699 A1 | 4/2003 | Burns |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0103133 A1 | 5/2004 | Gurney |
| 2004/0122882 A1 | 6/2004 | Zakharov et al. |
| 2004/0148321 A1 | 7/2004 | Guevorkian et al. |
| 2004/0172439 A1 | 9/2004 | Lin |
| 2004/0178818 A1 | 9/2004 | Crotty et al. |
| 2004/0193981 A1 | 9/2004 | Clark et al. |
| 2004/0267857 A1 | 12/2004 | Abel et al. |
| 2004/0267863 A1 | 12/2004 | Bhushan et al. |
| 2005/0038842 A1 | 2/2005 | Stoye |
| 2005/0144212 A1 | 6/2005 | Simkins et al. |
| 2005/0144215 A1 | 6/2005 | Simkins et al. |
| 2005/0144216 A1 | 6/2005 | Simkins et al. |
| 2005/0166038 A1 | 7/2005 | Wang et al. |
| 2005/0187997 A1 | 8/2005 | Zheng et al. |
| 2005/0187999 A1 | 8/2005 | Zheng et al. |
| 2005/0262175 A1 | 11/2005 | Iino et al. |
| 2006/0020655 A1 | 1/2006 | Lin |
| 2006/0112160 A1 | 5/2006 | Ishii et al. |
| 2007/0083585 A1 | 4/2007 | St. Denis et al. |
| 2007/0185951 A1 | 8/2007 | Lee et al. |
| 2007/0185952 A1 | 8/2007 | Langhammer et al. |
| 2007/0241773 A1 | 10/2007 | Hutchings et al. |
| 2008/0133627 A1 | 6/2008 | Langhammer et al. |
| 2008/0159441 A1 | 7/2008 | Liao et al. |
| 2008/0183783 A1 | 7/2008 | Tubbs |
| 2009/0083358 A1 | 3/2009 | Allen |
| 2009/0113186 A1 | 4/2009 | Kato et al. |
| 2009/0172052 A1 | 7/2009 | DeLaquil et al. |
| 2009/0182795 A1* | 7/2009 | Dobbek et al. ........... 708/209 |
| 2009/0187615 A1 | 7/2009 | Abe et al. |
| 2009/0228689 A1 | 9/2009 | Muff et al. |
| 2009/0292750 A1* | 11/2009 | Reyzin et al. ............ 708/209 |
| 2009/0300088 A1 | 12/2009 | Michaels et al. |
| 2010/0098189 A1 | 4/2010 | Oketani |
| 2010/0146022 A1 | 6/2010 | Swartzlander et al. |
| 2010/0191939 A1 | 7/2010 | Muff et al. |
| 2012/0166512 A1 | 6/2012 | Wong et al. |

FOREIGN PATENT DOCUMENTS

| | | |
|---|---|---|
| EP | 0 411 491 | 2/1991 |
| EP | 0 419 105 | 3/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 721 159 | 7/1996 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| GB | 2 283 602 | 5/1995 |
| GB | 2 286 737 | 8/1995 |
| GB | 2 318 198 | 4/1998 |
| JP | 61-237133 | 10/1986 |
| JP | 63-216131 | 8/1988 |
| JP | 4-332036 | 11/1992 |
| JP | 5-134851 | 6/1993 |
| JP | 06-187129 | 7/1994 |
| JP | 7-135447 | 5/1995 |
| JP | 11-296345 | 10/1999 |
| JP | 2000-259394 | 9/2000 |
| JP | 2002-108606 | 4/2002 |
| JP | 2002-251281 | 9/2002 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |
| WO | WO 2005/066832 | 7/2005 |
| WO | WO2005/101190 | 10/2005 |

OTHER PUBLICATIONS

Govindu, G. et al., "A Library of Parameterizable Floating-Point Cores for FPGAs and Their Application to Scientific Computing," *Proc Int'l Conf. Eng. Reconfigurable Systems and Algorithms (ERSA'05)*, Jun. 2005.

Govindu, G. et al., "Analysis of High-performance Floating-point Arithmetic on FPGAs," *Proceedings of the 18th International Parallel and Distributed Processing Symposium (PDPS'04)*, pp. 149-156, Apr. 2004.

Nakasato, N., et al., "Acceleration of Hydrosynamical Simulations using a FPGA board", *The Institute of Electronics Information and Communication Technical Report CPSY2005-47*, vol. 105, No. 515, Jan. 17, 2006.

Osana, Y., et al., "Hardware-resource Utilization Analysis on an FPGA-Based Biochemical Simulator ReCSiP", *The Institute of Electronics Information and Communication Technical Report CPSY2005-63*, vol. 105, No. 516, Jan. 18, 2006.

Vladimirova, T. et al., "Floating-Point Mathematical Co-Processor for a Single-Chip On-Board Computer," *MAPLD'03 Conference, D5*, Sep. 2003.

Xilinx, Inc., "Implementing Barrel Shifters Using Multipliers," p. 1-4, Aug. 17, 2004.

Altera Corporation, "DSP Blocks in Stratix II and Stratix II GX Devices," *Stratix II Device Handbook*, vol. 2, Chapter 6, v4.0 (Oct. 2005).

Underwood, K. "FPGAs vs. CPUs: Trends in Peak Floating-Point Performance," *Proceedings of the 2004 ACM/SIGDA 12th International Symposium on Field Programmable Gate Arrays*, pp. 171-180, Feb. 22-24, 2004.

Xilinx Inc., "XtremeDSP Design Considerations User Guide," v 1.2, Feb. 4, 2005.

Altera Corporation, "Digital Signal Processing (DSP)," *Stratix Device Handbook*, vol. 2, Chapter 6 and Chapter 7, v1.1 (Sep. 2004).

Fujioka, Y., et al., "240MOPS Reconfigurable Parallel VLSI Processor for Robot Control," *Proceedings of the 1992 International Conference on Industrial Electronics, Control, Instrumentation, and Automation: Signal Processing and Systems Control; Intelligent Sensors and Instrumentation*, vol. 3, pp. 1385-1390, Nov. 9-13, 1992.

Altera Corporation, "Stratix II Device Handbook, Chapter 6—DSP Blocks in Stratix II Devices," v1.1, Jul. 2004.

Xilinx Inc., "Complex Multiplier v2.0", DS291 Product Specification/Datasheet, Nov. 2004.

Martinson, L. et al., "Digital Matched Filtering with Pipelined Floating Point Fast Fourier Transforms (FFT's)," *IEEE Transactions on Acoustics, Speech, and Signal Processing*, vol. ASSP-23, No. 2, pp. 222-234, Apr. 1975.

Haynes, S.D., et al., "Configurable multiplier blocks for embedding in FPGAs," *Electronics Letters*, vol. 34, No. 7, pp. 638-639 (Apr. 2, 1998).

Amos, D., "PLD architectures match DSP algorithms," *Electronic Product Design*, vol. 17, No. 7, Jul. 1996, pp. 30, 32.

Analog Devices, Inc., The Applications Engineering Staff of Analog Devices, DSP Division, *Digital Signal Processing Applications Using the ADSP-2100 Family* (edited by Amy Mar), 1990, pp. 141-192).

Andrejas, J., et al., "Reusable DSP functions in FPGAs," *Field-Programmable Logic and Applications. Roadmap to Reconfigurable*

(56) References Cited

OTHER PUBLICATIONS

*Computing. 10th International Conference, FPL 2000. Proceedings (Lecture Notes in Computer Science* vol. 1896), Aug. 27-30, 2000, pp. 456-461.

Aoki, T., "Signed-weight arithmetic and its application to a field-programmable digital filter architecture," *IEICE Transactions on Electronics*, 1999, vol. E82C, No. 9, Sep. 1999, pp. 1687-1698.

Ashour, M.A., et al., "An FPGA implementation guide for some different types of serial-parallel multiplier-structures," *Microelectronics Journal*, vol. 31, No. 3, 2000, pp. 161-168.

Berg. B.L., et al. "Designing Power and Area Efficient Multistage FIR Decimators with Economical Low Order Filters," *ChipCenter Technical Note*, Dec. 2001.

Bursky, D., "Programmable Logic Challenges Traditional ASIC SoC Designs", *Electronic Design*, Apr. 15, 2002.

Chhabra, A. et al., Texas Instruments Inc., "A Block Floating Point Implementation on the TMS320C54x DSP", Application Report SPRA610, Dec. 1999, pp. 1-10.

Colet, p., "When DSPs and FPGAs meet: Optimizing image processing architectures," *Advanced Imaging*, vol. 12, No. 9, Sep. 1997, pp. 14, 16, 18.

Crookes, D., et al., "Design and implementation of a high level programming environment for FPGA-based image processing," *IEE Proceedings-Vision, Image and Signal Processing*, vol. 147, No. 4, Aug. 2000, pp. 377-384.

Debowski, L., et al., "A new flexible architecture of digital control systems based on DSP and complex CPLD technology for power conversion applications," *PCIM 2000: Europe Official Proceedings of the Thirty-Seventh International Intelligent Motion Conference*, Jun. 6-8, 2000, pp. 281-286.

Dick, C., et al., "Configurable logic for digital communications: some signal processing perspectives," *IEEE Communications Magazine*, vol. 37, No. 8, Aug. 1999, pp. 107-111.

Do, T.-T., et al., "A flexible implementation of high-performance FIR filters on Xilinx FPGAs," *Field-Programmable Logic and Applications: From FPGAs to Computing Paradigm. 8th International Workshop, FPL'98. Proceedings*, Hartenstein, R.W., et al., eds., Aug. 31-Sep. 3, 1998, pp. 441-445.

Gaffer, A.A., et al., "Floating-Point Bitwidth Analysis via Automatic Differentiation," *IEEE Conference on Field Programmable Technology*, Hong Kong, Dec. 2002.

Guccione, S.A., "Run-time Reconfiguration at Xilinx," *Parallel and distributed processing: 15 IPDPS 2000 workshops*, Rolim, J., ed., May 1-5, 2000, p. 873.

Hauck, S., "The Future of Reconfigurable Systems," *Keynote Address, 5th Canadian Conference on Field Programmable Devices*, Jun. 1998, http://www.ee.washington.edu/people/faculty/hauck/publications/ReconfigFuture.PDF.

Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science* vol. 1896) Aug. 27-30, 2000, pp. 400-411.

Huang, J., et al., "Simulated Performance of 1000BASE-T Receiver with Different Analog Front End Designs," Proceedings of the 35th Asilomar Conference on Signals, Systems, and Computers, Nov. 4-7, 2001.

Lattice Semiconductor Corp, *ORCA® FPGA Express™ Interface Manual: ispLEVER® Version 3.0*, 2002.

Lucent Technologies, Microelectronics Group, "Implementing and Optimizing Multipliers in ORCA™ FPGAs,", Application Note. AP97-008FGPA, Feb. 1997.

"Implementing Multipliers in FLEX 10K EABs", *Altera*, Mar. 1996.

"Implementing Logic with the Embedded Array in FLEX 10K Devices", *Altera*, May 2001, ver. 2.1.

Jinghua Li, "Design a pocket multi-bit multiplier in FPGA," *1996 2nd International Conference on ASIC Proceedings (IEEE Cat. No. 96TH8140)*, Oct. 21-24, 1996, pp. 275-279.

Jones, G., "Field-programmable digital signal conditioning," *Electronic Product Design*, vol. 21, No. 6, Jun. 2000, pp. C36-C38.

Kiefer, R., et al., "Performance comparison of software/FPGA hardware partitions for a DSP application" *14th Australian Microelectronics Conference. Microelectronics: Technology Today for the Future. MICRO '97 Proceedings*, Sep. 28-Oct. 1, 1997, pp. 88-93.

Kramberger, I., "DSP acceleration using a reconfigurable FPGA," *ISIE '99. Proceedings of the IEEE International Symposium on Industrial Electronics (Cat. No. 99TH8465)*, vol. 3, Jul. 12-16, 1999, pp. 1522-1525.

Langhammer, M., "How to implement DSP in programmable logic," *Elettronica Oggi*, No. 266, Dec. 1998, pp. 113-115.

Langhammer, M., "Implementing a DSP in Programmable Logic," *Online EE Times*, May 1998, http://www.eetimes.com/editorial/1998/coverstory9805.html.

Lazaravich, B.V., "Function block oriented field programmable logic arrays," *Motorola, Inc. Technical Developments*, vol. 18, Mar. 1993, pp. 10-11.

Lund, D., et al., "A new development system for reconfigurable digital signal processing," First International Conference on 3G Mobile Communication Technologies (Conf. Publ. No. 471), Mar. 27-29, 2000, pp. 306-310.

Miller, N.L., et al., "Reconfigurable integrated circuit for high performance computer arithmetic," *Proceedings of the 1998 IEE Colloquium on Evolvable Hardware Systems (Digest)*, No. 233, 1998, pp. 2/1-2/4.

Mintzer, L., "Xilinx FPGA as an FFT processor," *Electronic Engineering*, vol. 69, No. 845, May 1997, pp. 81, 82, 84.

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation (Cat. No. 91CH2976-9)* vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture" *RAWCON 2000: 2000 IEEE Radio and Wireless Conference (Cat. No. 00EX404)*.Sep. 10-13, 2000, pp. 135-138.

Parhami, B., "Configurable arithmetic arrays with data-driven control," *34th Asilomar Conference on Signals, Systems and Computers*, vol. 1, 2000, pp. 89-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications (Cat. No. 99EX303)*, Jul. 26-28, 1999, pp. 147-150.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL'99, Proceedings (Lecture Notes in Computer Science* vol. 1673) Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

(56) References Cited

OTHER PUBLICATIONS

"Virtex-II 1.5V Field-Programmable Gate Arrays", *Xilinx*, Apr. 2, 2001, module 2 of 4.
Walters, A.L., "A Scaleable FIR Filter Implementation Using 32-bit Floating-Point Complex Arithmetic on ,a FPGA Based Custom Computing Platform," Allison L. Walters, Thesis Submitted to the Faculty of Virginia Polytechnic Institute and State University, Jan. 30, 1998.
Weisstein, E.W., "Karatsuba Multiplication " *MathWorld—A Wolfram Web Resource* (Dec. 9, 2007), accessed Dec. 11, 2007 at http://mathworld.wolfram.com/KaratsubaMultiplication.html.
Wenzel, L., "Field programmable gate arrays (FPGAs) to replace digital signal processor integrated circuits," *Elektronik*, vol. 49, No. 5, Mar. 7, 2000, pp. 78-86.
"Xilinx Unveils New FPGA Architecture to Enable High-Performance, 10 Million System Gate Designs", *Xilinx*, Jun. 22, 2000.
"Xilinx Announces DSP Algorithms, Tools and Features for Virtex-II Architecture", *Xilinx*, Nov. 21, 2000.
Xilinx Inc., "Virtex-II 1.5V Field-Programmable Gate Arrays", Advance Product Specification, DS031-2 (v1.9), Nov. 29, 2001, Module 2 of 4, pp. 1-39.
Xilinx Inc., "Using Embedded Multipliers", Virtex-II Platform FPGA Handbook, UG002 (v1.3), Dec. 3, 2001, pp. 251-257.
Xilinx, Inc., "A 1D Systolic FIR," copyright 1994-2002, downloaded from http://www.iro.umontreal.ca/~aboulham/F6221/Xilinx%20A%201D%20systolic%20FIR.htm.
Xilinx, Inc., "The Future of FPGA's," White Paper, available Nov. 14, 2005 for download from http://www.xilinx.com/prs_rls,5yrwhite.htm.
Kim, Y., et al., "Fast GPU Implementation for the Solution of Tridiagonal Matrix Systems," *Journal of Korean Institute of Information Scientists and Engineers*, vol. 32, No. 12, pp. 692-704, Dec. 2005.
Altera, "DSP Blocks in Stratix III Devices", Chapter 5, pp. 1-42, Mar. 2010.
Karlström, P., et al., "High Performance, Low Latency FPGA based Floating Point Adder and Multiplier Units in a Virtex 4," Norchip Conf., pp. 31-34, 2006.
Thapliyal, H., et al., "Combined Integer and Floating Point Multiplication Architecture (CIFM) for FPGSs and Its Reversible Logic Implementation", *Proceedings MWSCAS 2006*, Puerto Rico, 5 pages, Aug. 2006.
Thapliyal, H., et al., "Combined Integer and Variable Precision (CIVP) Floating Point Multiplication Architecture for FPGAs", *Proceedings of the 2007 International Conference on Parallel and Distributed Processing Techniques and Applications (PDPTA'07)*, Las Vegas, US, vol. 1, pp. 449-450, Jun. 2007.
Xilinx, Inc., "Virtex-5 ExtremeDSP Design Considerations," *User Guide UG193*, v2.6, 114 pages, Oct. 2007.
Altera Corporation, "Advanced Synthesis Cookbook: A Design Guide for Stratix II, Stratix III and Stratix IV Devices," Document Version 3.0, 112 pgs., May 2008.
deDinechin, F. et al., "Large multipliers with less DSP blocks," retrieved from http://hal-ens-lyon.archives-ouvertes.fr/ensl-00356421/en/, 9 pgs., available online Jan. 2009.
Wajih, E.-H.Y. et al., "Efficient Hardware Architecture of Recursive Karatsuba-Ofman Multiplier," *3rd International Conference on Design and Technology of Integrated Systems in Nanoscale Era*, 6 pgs, Mar. 2008.
Zhou, G. et al., "Efficient and High-Throughput Implementations of AES-GCM on FPGAs," *International Conference on Field-Programmable Technology*, 8 pgs., Dec. 2007.

\* cited by examiner

CONFIGURING FLOATING POINT OPERATIONS IN A PROGRAMMABLE DEVICE

CROSS REFERENCE TO RELATED APPLICATION

This is a continuation-in-part of copending, commonly-assigned U.S. patent application Ser. No. 11/625,655, filed Jan. 22, 2007, which is hereby incorporated by reference herein in its entirety.

BACKGROUND OF THE INVENTION

This invention relates to performing floating point arithmetic operations in programmable devices, such as programmable logic devices (PLDs), including the use of specialized processing blocks, which may be included in such devices, to perform floating point operations.

As applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals. Such blocks are frequently also referred to as multiply-accumulate ("MAC") blocks, because they include structures to perform multiplication operations, and sums and/or accumulations of multiplication operations.

For example, PLDs sold by Altera Corporation, of San Jose, Calif., under the family name STRATIX® includes DSP blocks, each of which includes a plurality of multipliers (e.g., four 18-bit-by-18-bit multipliers). Each of those DSP blocks also includes adders and registers, as well as programmable connectors (e.g., multiplexers) that allow the various components to be configured in different ways. In each such block, the multipliers can be configured not only as individual multipliers, but also as four smaller multipliers, or as one larger multiplier (e.g., one 36-bit-by-36-bit multiplier in the case of four 18-bit-by-18-bit multipliers). In addition, e.g., one complex multiplication (which decomposes into two multiplication operations for each of the real and imaginary parts) can be performed. In order to support four 18-bit-by-18-bit multiplication operations, a block in a member of the aforementioned STRATIX® device family may have 4×(18+18)=144 inputs. Similarly, the output of an 18-bit-by-18-bit multiplication is 36 bits wide, so to support the output of four such multiplication operations, such a block would have 36×4=144 outputs.

The arithmetic operations to be performed by a PLD frequently are floating point operations. However, to the extent that known PLDs, with or without DSP blocks or other specialized blocks or structures, including the aforementioned STRATIX® family of PLDs, can perform floating point operations at all, they operate in accordance with the IEEE754-1985 standard, which requires that values be normalized at all times because it implies a leading "1". However, that leads to certain inefficiencies as described below.

SUMMARY OF THE INVENTION

The present invention relates to programmable devices having improved floating point operation capabilities. In particular, the present invention carries out floating point operations without normalization, although the results may be normalized if IEEE754-1985 compliance is required. In addition, normalization may be performed in intermediate steps if loss of data might otherwise result.

Therefore, in accordance with the present invention, there is provided a method of configuring a programmable device to perform floating point operations on input values formatted in accordance with a standard requiring a first mantissa size and a first exponent size. The method includes configuring logic of the programmable device to reformat the input values to have an initial mantissa size different from the first mantissa size. Logic of said programmable device also is configured to perform a tree of successive operations to compute a final result. Each respective operation in a first level of the tree of successive operations has a first number of the reformatted input values as inputs and provides a respective first intermediate result having a mantissa size increased by at least one bit left of its binal point as compared to the initial mantissa size. Each operation in a respective successive level of the tree of successive operations after the first level of said tree of successive operations, other than a final level, has the first number of inputs and provides a respective intermediate result and the final level provides the final result. Each of the respective intermediate results and the final result is unnormalized and has a mantissa size increased by at least one bit left of its binal point as compared to an intermediate result on an immediately preceding level. Logic of the programmable device also is configured to reformat the result in accordance with the standard to the first mantissa size.

A programmable device so configured, and a machine-readable data storage medium encoded with software for performing the method, are also provided.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
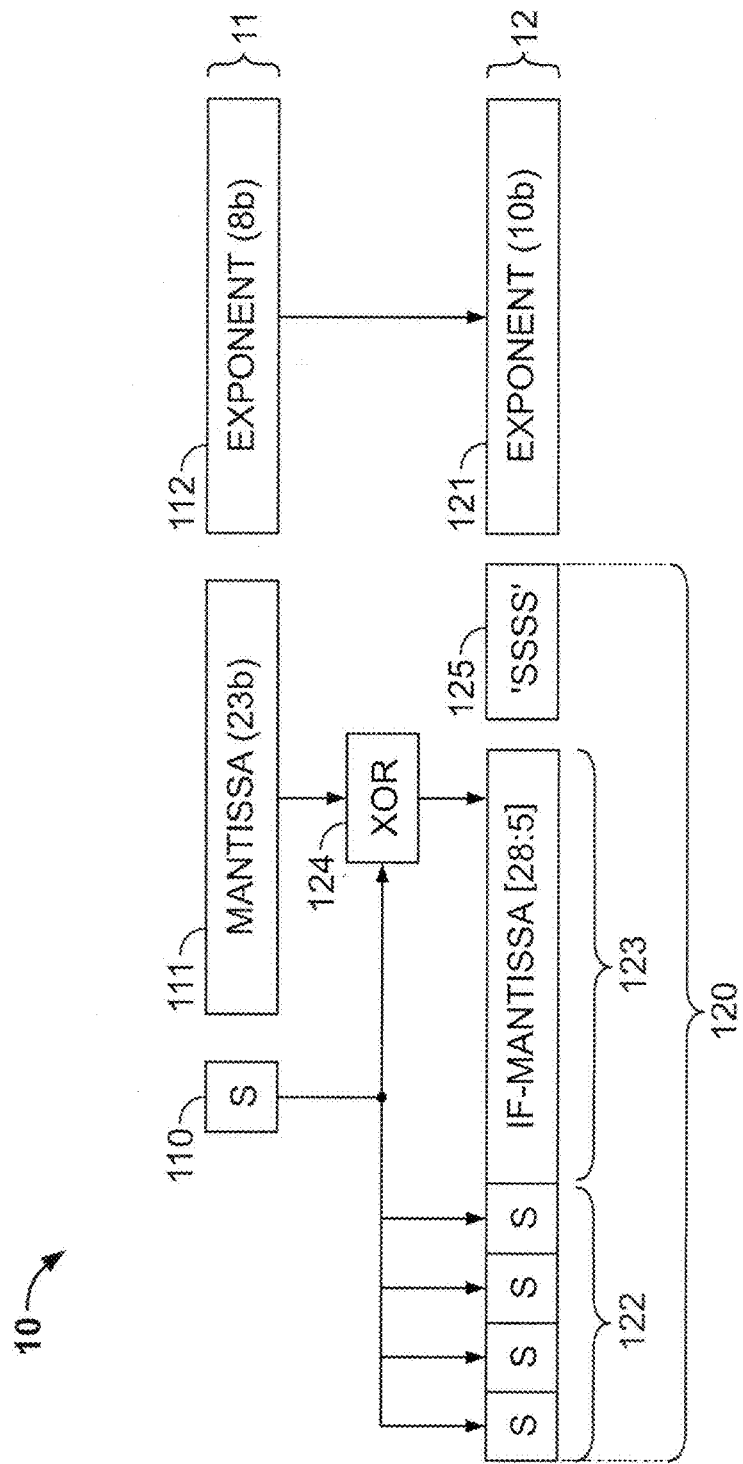
FIG. 1 is a schematic representation of conversion of numbers according to the IEEE754-1985 standard format to a preferred embodiment of a format according to the present invention.

Floating point numbers are commonplace for representing real numbers in scientific notation in computing systems. Examples of real numbers in scientific notation are:

$3.14159265_{10} \times 10^0$ ($\pi$)

$2.718281828_{10} \times 10^0$ (e)

$0.000000001_{10}$ or $1.0_{10} \times 10^{-9}$ (seconds in a nanosecond)

$3155760000_{10}$ or $3.15576_{10} \times 10^9$ (seconds in a century)

The first two examples are real numbers in the range of the lower integers, the third example represents a very small fraction, and the fourth example represents a very large integer. Floating point numbers in computing systems are designed to cover the large numeric range and diverse precision requirements shown in these examples. Fixed point number systems have a very limited window of representation which prevents them from representing very large or very small numbers simultaneously. The position of the notional binary-point in fixed point numbers addresses this numeric range problem to a certain extent but does so at the expense of precision. With a floating point number the window of representation can move, which allows the appropriate amount of precision for the scale of the number.

Floating point representation is generally preferred over fixed point representation in computing systems because it permits an ideal balance of numeric range and precision. However, floating point representation requires more complex implementation compared to fixed point representation.

The IEEE754-1985 standard is commonly used for floating point numbers. A floating point number includes three different parts: the sign of the number, its mantissa and its exponent. Each of these parts may be represented by a binary number and, in the IEEE754-1985 format, have the following bit sizes:

|  | Sign | Exponent | Bias | Mantissa |
| --- | --- | --- | --- | --- |
| Single Precision 32-Bit | 1 bit [31] | 8 bits [30 ... 23] | −127 | 23 bits [22 ... 00] |
| Double Precision 64-Bit | 1 bit [63] | 11 bits [62 ... 52] | −1023 | 52 bits [51 ... 0] |

The exponent preferably is an unsigned binary number which, for the single precision format, ranges from 0 to 255. In order to represent a very small number, it is necessary to use negative exponents. To achieve this the exponent preferably has a negative bias associated with it. For single-precision numbers, the bias preferably is −127. For example a value of 140 for the exponent actually represents (140-127)=13, and a value of 100 represents (100-127)=−27. For double precision numbers, the exponent bias preferably is −1023.

As discussed above, according to the standard, the mantissa is a normalized number—i.e., it has no leading zeroes and represents the precision component of a floating point number. Because the mantissa is stored in binary format, the leading bit can either be a 0 or a 1, but for a normalized number it will always be a 1. Therefore, in a system where numbers are always normalized, the leading bit need not be stored and can be implied, effectively giving the mantissa one extra bit of precision. Therefore, in single precision format, the mantissa typically includes 24 bits of precision.

However, the IEEE754-1985 standard requires continuous normalization—i.e., normalization after every step of a multistep computation—to maintain the leading "1" to preserve accuracy. This is expensive in terms of PLD resources, as each normalization operation requires two steps—(1) finding the position of the "1", and (2) shifting the fractional part to get a leading "1" (which is then eliminated, because it is implied).

In accordance with the invention, there is no implied leading "1", so that normalization is not required. Although this requires that one bit of precision be given up, because all bits must be kept, rather than implied, this greatly reduces the required logic, particularly shifting logic, and therefore the latency of the floating point operations. Moreover, in a PLD that already has dedicated arithmetic circuits, such as multipliers and/or adders, that are capable of handling the extra bits, there is no additional cost in terms of logic resources to handle those extra bits.

Preferably, the floating point representation in accordance with the invention uses a signed fractional component, with greater precision. Some operations may be configured in general-purpose logic of the programmable logic device. However, multiplication, at least, is more efficiently performed in a dedicated multiplier such as may be available in the aforementioned DSP block. The extra precision in accordance with the invention requires large multipliers, which heretofore have consumed more resources than the shifting logic required for normalization. However, in the aforementioned STRATIX® II PLDs, as well as those described in copending, commonly-assigned U.S. patent application Ser. Nos. 11/447,329, 11/447,370, 11/447,472 and 11/447,474, all filed Jun. 5, 2006, 11/426,403, filed Jun. 26, 2006, and 11/458,361, filed Jul. 18, 2006, each of which is hereby incorporated herein in its respective entirety, large dedicated multipliers are available, and are more efficient than shifting logic. This allows the efficient use of a signed fractional component.

Specifically, according to a preferred method according to the invention for configuring a programmable logic device to perform floating point operations, the programmable logic device preferably is configured so that floating point values in accordance with a first format, such as the IEEE754-1985 standard format, preferably are converted to an internal format for calculation purposes, and are reconverted to the standard format upon completion of the operations.

Whereas the IEEE754-1985 standard format includes a 24-bit unsigned mantissa (23 bits plus the implied "1") and an 8-bit exponent, the internal format according to the invention preferably includes a 32-bit signed mantissa and a 10-bit exponent. When converting from the standard 24-bit format to the 32-bit format of the invention, the implied leading "1" of the mantissa is made explicit and preferably is initially positioned at the 28th bit location. This leaves the four most significant bits of the 32-bit number available for overflows as operations progress. For example, 16 additions could be performed before any overflow would consume all four bits. Similarly, because the original standard representation is only 24 bits wide, the four least significant bits also are available for any underflows that may occur.

If this method is implemented on the aforementioned STRATIX® II PLD, or on a PLD of any of the above-incorporated patent applications, which include DSP blocks capable of 36-bit multiplications, then the multiplications of the 32-bit mantissas can be accomplished within the 36-bit dedicated multipliers, making the multipliers more efficient. Moreover, the mantissa size could be expanded to 36 bits if necessary or desired. However, the invention could be implemented even where no dedicated multipliers are available, using programmed general-purpose logic. Moreover, if dedicated multipliers are available, but are only large enough for IEEE754-1985-compliant operations, computations other than multiplications could be performed in programmed general-purpose logic, with the multiplications being performed in the dedicated multipliers. In such a case, the values would have to be renormalized before each multiplication step, but would not have to be normalized for other steps either before or after a multiplication step, except at the end of the operation.

As stated above, preferably, and ordinarily, during floating point operations in accordance with the invention, the operands remain in the format according to the invention, and are converted back to their original format only upon completion of operations. Because of the initial presence of the leading and trailing bits, as well as the larger exponent size, during operations it is possible to continue beyond conditions that might have led to overflows or underflows in the original format, because of the possibility that the accumulation of further results may reverse the overflow or underflow condition.

However, if during operation the accumulation of underflows or overflows reaches the point that information may be lost—e.g., there would be an overflow if the data were converted back to the standard format, or an underflow would be approached such that fewer than three significant bits beyond the required mantissa precision (i.e., in this example, fewer than 1+23+3=27 bits) would remain—it may be desirable in accordance with the invention to normalize the data at an intermediate step to prevent lost of precision. In such a case, subsequent operations preferably would not include further normalization until the final result is achieved (unless a condition again arises in which data may be lost).

Alternatively, if overflow or underflow is likely (e.g., there will be many operations in a calculation), then the start position of the mantissa can be changed from the 28th bit position to another position (to the right to prevent overflows; to the left to prevent underflows). The correct result can be maintained by adjusting the exponents accordingly. The larger exponent size (10 bits instead of 8 bits) allows room for the necessary exponent adjustments.

The examples that follow illustrate configurations, in accordance with the invention, of a programmable logic device to perform a number of different arithmetic operations. For simplicity, these examples do not show pipelining between stages, nor do they show circuitry for handling special cases, such as zero, infinity or not-a-number (NAN) situations.

The examples include conversions in both directions between the format of the IEEE754-1985 standard and the internal format according to a preferred embodiment of this invention. Preferred embodiments of those conversions are illustrated in FIGS. 1 and 2.

Figure 2:
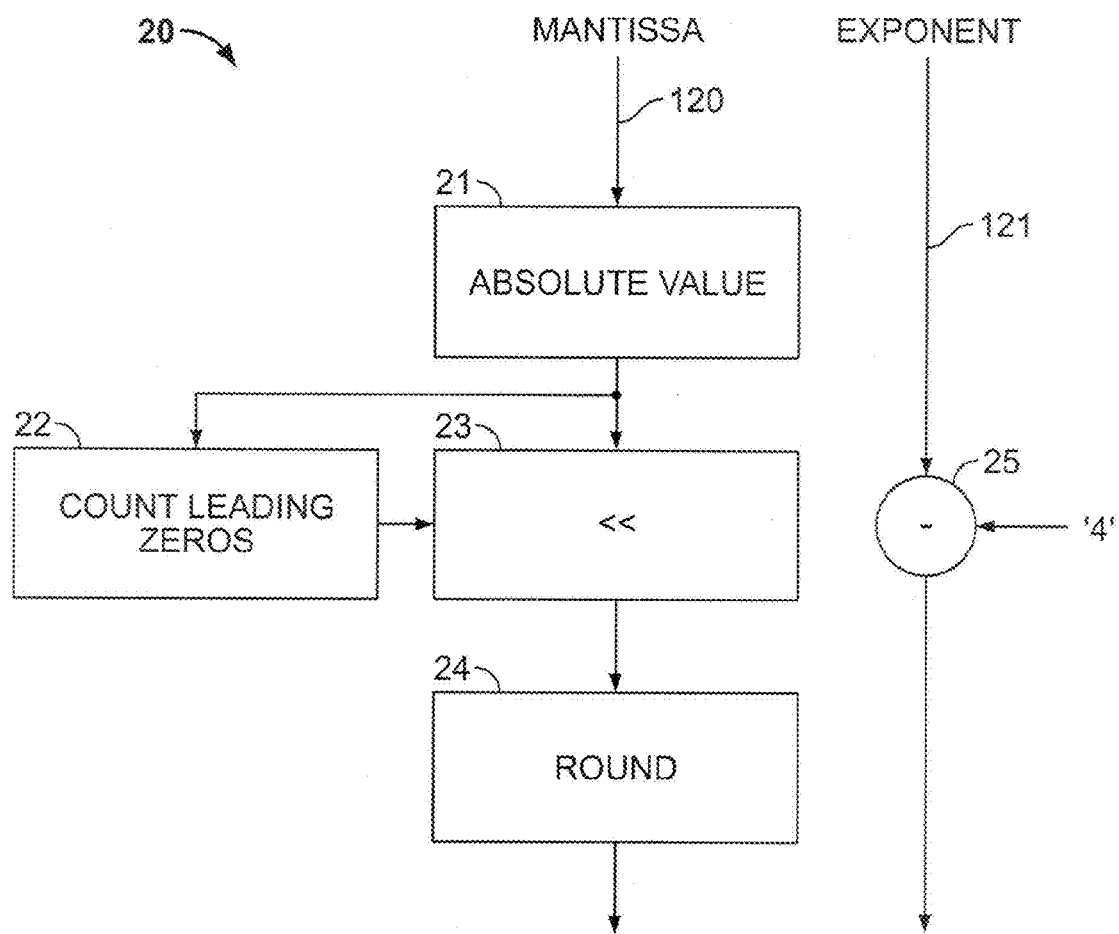
FIG. 2 is a schematic representation of conversion of numbers according to a preferred embodiment of a format according to the present invention to the IEEE754-1985 standard format.

FIG. 1 shows a preferred embodiment of the conversion 10 from a value represented in the IEEE754-1985 standard format 11 to the same value represented, in the embodiment described above, in the format 12 according to the present invention. As seen, in format 11, the value is indicated by three numbers representing the sign 110, the mantissa 111 and the exponent 112. As indicated above, sign 110 is one bit wide, mantissa 111 is 23 bits wide but represents 24 bits of precision because it has an implied leading "1", and exponent 112 is eight bits wide. In format 12, there is no separate number representing the sign, while signed mantissa 120 is 32 bits wide and exponent 121 is ten bits wide.

As shown in FIG. 1, exponent 112 converts directly to exponent 121 by the addition of two leading zeroes, as clearly the value of the exponent cannot change. The availability of two extra bits, however, provides for greater ranging of the value during internal computations, prior to conversion back to the IEEE754-1985 standard. This helps reduce the occurrence of overflows and underflows.

Sign bit 110 and 23-bit-wide mantissa 111 (carrying 24 bits of precision) convert to four sign bits 122 and 24-bit mantissa portion 123 with the aid of exclusive-OR (XOR) 124. Four trailing bits 125 (because again the value cannot change in the conversion) are added to provide 32-bit mantissa 120. The trailing bits are zeroes for positive numbers, and ones for negative numbers (which are inverted).

The operation of XOR 124 preferably is as follows:

If sign bit 110 is a "0", then XOR 124 has no effect. If sign bit 110 is a "1" (signifying a negative number), then XOR 124 inverts the mantissa—i.e., it converts the mantissa to a one's-complement number. The actual computation requires a two's-complement number. The one's-complement number can be converted to a two's-complement number by adding a "1" to the least significant bit of the one's-complement number. An adder can be provided as part of each conversion 10. However, such adders are very large, and because the precision of the mantissa in the format according to the present invention is greater than that of the IEEE754-1985 mantissa, it is also possible to omit this addition completely without significantly affecting the result.

As a third alternative, a single adder can be provided after a group of conversions 10, which adds to the result a number equal to the total number of negative numbers within that group of conversions 10. For example, if in an addition of eight numbers (meaning there are eight conversions), five of those numbers are negative, the value $5_{10}$ ($101_2$) can be added to the one's-complement result to give the two's-complement result. This becomes more complicated in the case of multiplications, but can still be used where there is a local cluster of operations.

FIG. 2 shows the conversion 20 from a value represented in the format 12 according to the present invention to the same value represented in the IEEE754-1985 standard format 11. As seen, in block 21, the absolute value of mantissa 120 is taken, because the mantissa is signed in the format according to the invention, but unsigned in the IEEE784-1985 format. After that, the conversion operates similarly to the conversion under the IEEE754-1985 standard. Thus, in block 22 the number of leading zeroes is counted to find the implied leading "1". The mantissa is then left-shifted in block 23 by the number found in block 22. Any necessary rounding is performed in block 24. To convert exponent 121, an offset adjustment is subtracted from the exponent by subtractor 25 to account for the position of the implied leading "1" during the original conversion 10 to the format according to the invention. The offset adjustment typically is $4_{10}$ ($100_2$) a shown, but if the mantissa size or position of the leading "1" on conversion changes, the offset adjustment to the exponent would change as well to compensate.

In FIGS. 3-6, "IF" (internal format) refers to a preferred embodiment (as described above) of the format according to the present invention, while "IEEE754" refers to the format according to the IEEE754-1985 standard.

Figure 3:
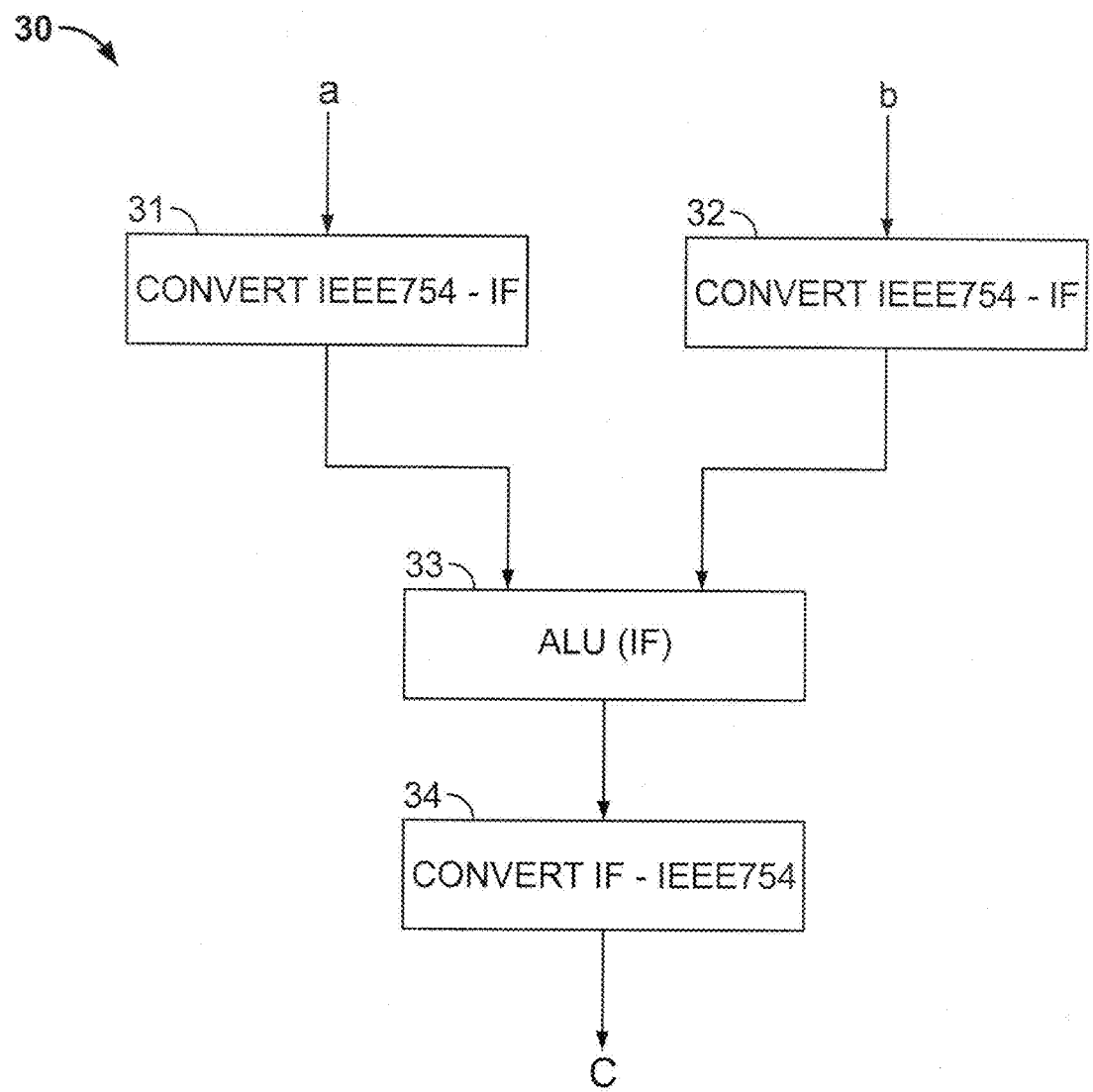
FIG. 3 is a schematic representation of the configuration of a simple addition in accordance with the invention.

FIG. 3 shows a simple case 30 of configuring logic to add two floating point numbers a and b to obtain their floating point sum c. In this case 30, a first block 31 of logic preferably is configured from programmable logic to convert a from the IEEE754-1985 standard format to the internal format, and a second block 32 of logic preferably is configured from programmable logic to convert b from the IEEE754-1985 standard format to the internal format. Blocks 31 and 32 preferably are substantially identical. An arithmetic logic unit (ALU) 33 preferably is configured from programmable logic to add the values of a and b in the internal format. A block 34 preferably is configured to convert the result c back to IEEE754-1985 standard format from the internal format.

ALU 33, operating in the internal format, is simpler than a corresponding ALU operating in the IEEE754-1985 standard format because it does not have include the shifting logic needed to deal with the implied leading "1" and therefore is about half the size of a standard-format ALU. However, conversion 34 adds about the same amount of logic as ALU 33, while conversions 31, 32 add a negligible amount of logic. Therefore, in this simple example of adding two numbers, the net result is approximately the same under either format in terms of circuit size and latency, because one standard-format ALU is replaced with two blocks each about half the size of the standard-format ALU.

Figure 4:
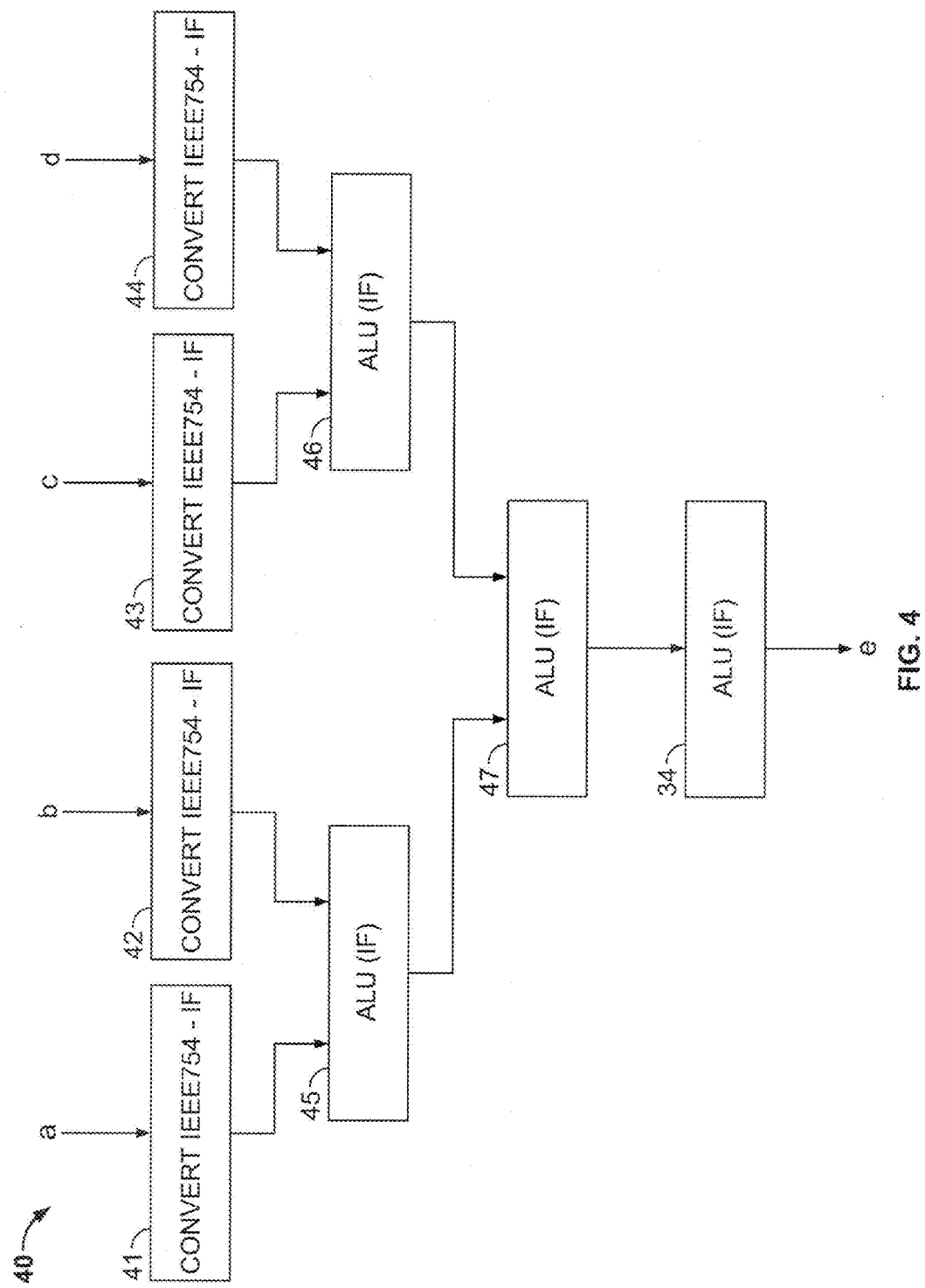
FIG. 4 is a schematic representation of the configuration of a somewhat more complicated addition in accordance with the invention.

FIG. 4 shows the more complex case 40 of adding together four numbers a, b, c and d. In this case 40, blocks 41-44 of logic preferably are configured from programmable logic to respectively convert a, b, c and d from the IEEE754-1985 standard format to the internal format. A first arithmetic logic unit (ALU) 45 preferably is configured from programmable logic to add the values of a and b in the internal format. ALU 46 similarly may be configured from programmable logic to add c and d in the internal format. ALU 47, also similarly configured from programmable logic may be provided to add the intermediate sums from ALU 45 and ALU 46. Block 34 preferably is configured from programmable logic to convert the result e back to IEEE754-1985 standard format from the internal format.

As in case 30, each of conversions 41-44 adds negligible logic, while each of ALUs 45-47, as well as conversion 34, adds half the logic of a standard-format ALU. Using the standard format, the operation of case 40 could have been performed with three standard-format ALUs, while in case 40, it is performed with four blocks (three ALUs 45-47 and conversion 34) approximating in total the size of two standard-format ALUs. Thus, the circuit is about two-thirds the size using the format according to the invention as compared to the standard format.

Figure 5:
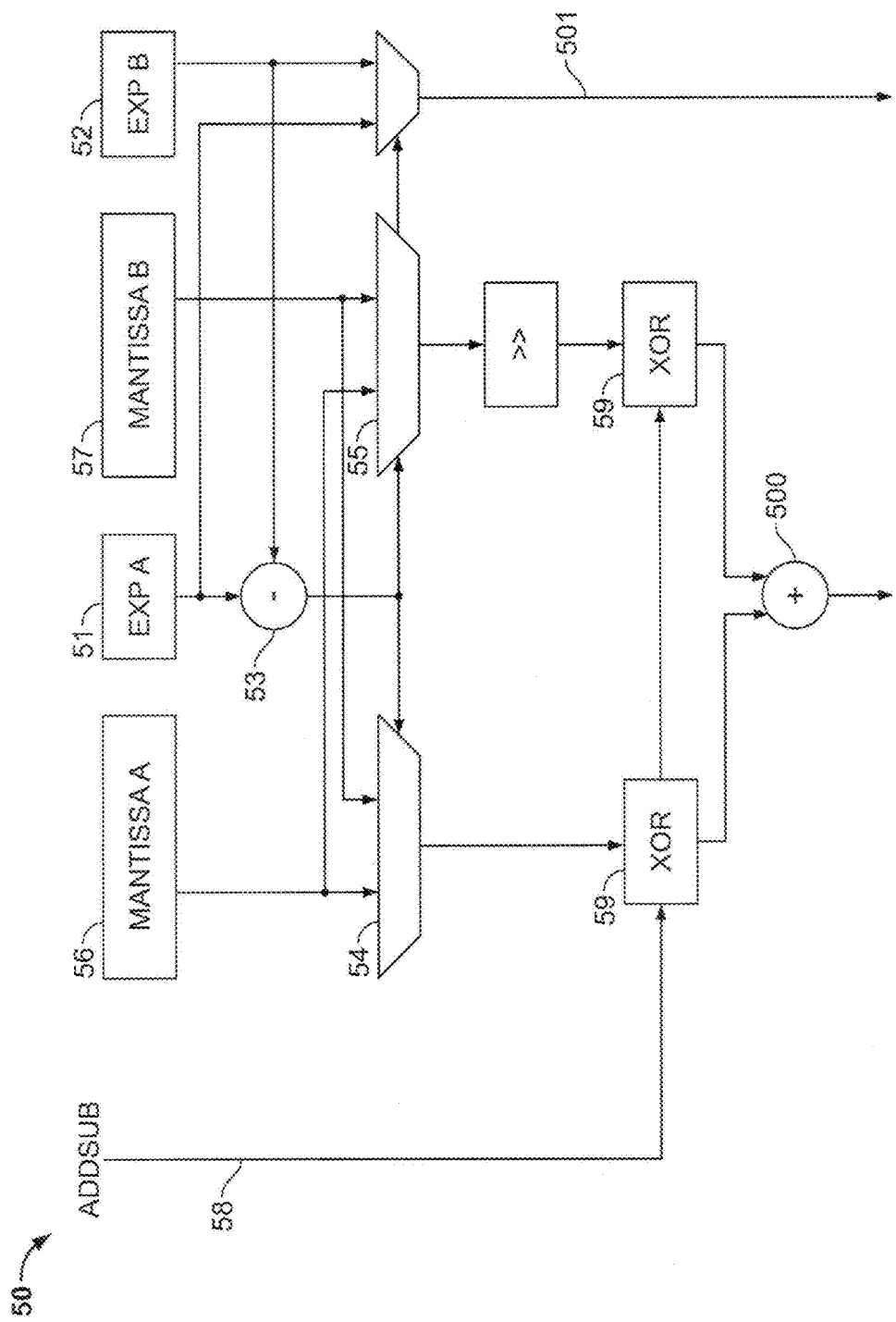
FIG. 5 is a schematic representation of the configuration of a preferred embodiment of an arithmetic logic unit in accordance with the invention.

FIG. 5 shows a preferred embodiment of the configuration of an ALU 50 for addition using the format according to the invention, which may be used as ALU 33, 45, 46 or 47. ALU 50 is similar to the first portion of a standard-format ALU. However, there is no normalization after the addition, which is where the size savings occurs. The two exponents 51, 52 are compared at 53, and the result is used to control multiplexers 54, 55 to right-shift the mantissa 56, 57 of the smaller number. Depending on the signs of the inputs and the ADDSUB control signal 58, none, one, or both of the numbers are one's-complemented at 59, then added at 500. The larger of the two input exponents 51, 52 is the resultant exponent 501. In a preferred embodiment, ALU 50 may be configured from programmable logic, but alternatively some of the components, such as adder 500, may be provided as dedicated circuitry.

Figure 6:
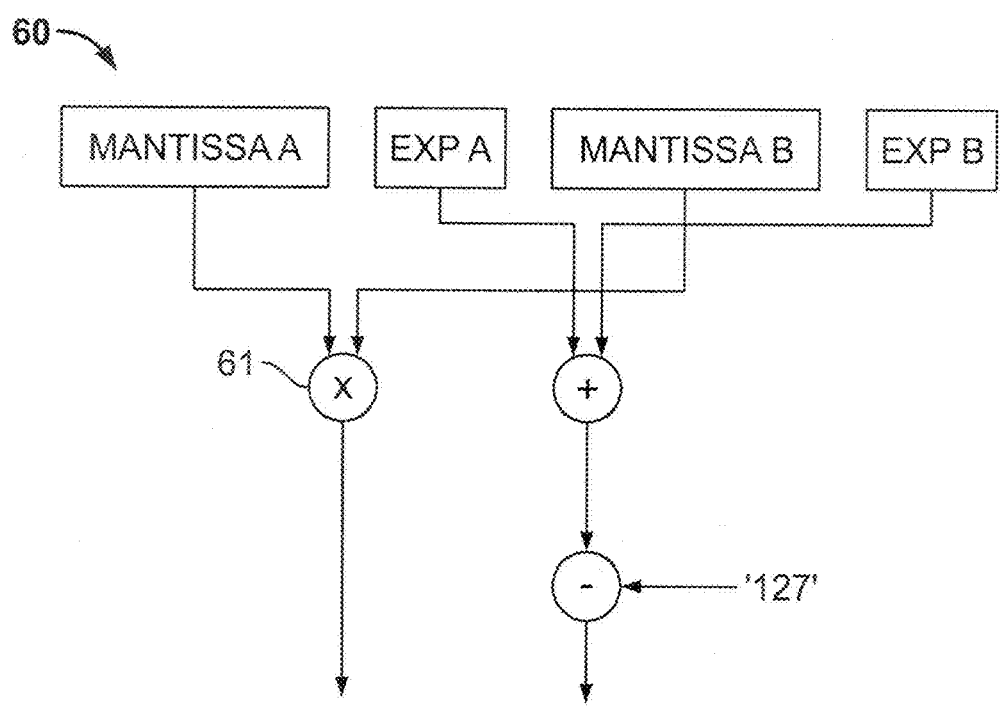
FIG. 6 is a schematic representation of the configuration of a preferred embodiment of a multiplier in accordance with the invention.

FIG. 6 shows a preferred embodiment of the configuration of a multiplier 60 for multiplication using the format according to the invention. Multiplier 60 is similar to the first portion of a standard-format multiplier. Multiplication circuitry 61 may be configured from programmable logic but preferably may be provided as dedicated circuitry as described above. As in the addition case, there is no normalization after the multiplication, resulting in size savings as compared to a standard-format multiplication. However, for multiplication, the normalization range is more limited—typically only one bit instead of 23 bits—so the savings are smaller. Small additional savings result from the elimination of the need for rounding, which is required in the standard format.

According to another aspect of the invention, instead of having a fixed internal format, with a fixed mantissa size, the mantissa size is adjusted for each step of a calculation. A normalized mantissa represents a magnitude of between $1.0_{10}$ and $1.999\ldots99_{10}$ at some given exponent. The number with the smaller exponent is has its mantissa (including the leading "1") right shifted by the difference between the two exponents. If the exponents are the same, then there is no shift. As a consequence, for two-input operations, the largest unnormalized mantissa at any node can be 3.99999, while the smallest can be 0 (the subtraction of two equal numbers). $3.999\ldots999$ in binary $11.11111\ldots111_2$. If two of these unnormalized numbers were added, the maximum result would be $7.9999\ldots9999_{10}$, represented in binary as $111.111\ldots111_2$. A tree of 16 numbers would have a maximum value of $31.999\ldots999_{10}$, or $11111.111\ldots111_2$. In signed magnitude format, there will be an additional bit to represent the sign.

Thus, for a multi-level addition using a binary tree (i.e., a tree of two-input adders), the mantissa size at the first, input, level is set according to the expected input values. At each level, the number of bits at the most-significant end—i.e., to the left of the "binal" point (the binary equivalent of a decimal point, separating places signifying values less than 1 from places signifying values greater than or equal to 1)—is increased by 1. Starting with a normalized input, with one bit to the left of the binal point (or two bits if there is a sign bit), at the first level and performing the first-level additions, the number of bits in the second-level input to the left of the binal point if there is no further normalization would be two (or three if there is a sign bit). After the second-level additions, there would be three (or four) bits to the left of the binal point in the third-level inputs. At the inputs to the nth level, then, the number of bits of wordgrowth as compared to the inputs to first level (n=1), is n−1.

For multi-input adders, the number of bits of wordgrowth at each level may be greater. Generally, if the "base," or number of inputs per adder, is m, then when m is a power of 2, the number of bits of wordgrowth per level is m/2. However, if the base is not a power of 2, the number of bits of wordgrowth will be irregular (although on average it may be m/2). For example, if using four-input adders (a "quaternary" tree), the number of bits of wordgrowth would be 2 per level.

However, if using, e.g., three-input adders (a "ternary" tree), the number of bits of wordgrowth would be 2 per level in some cases and 1 per level in other cases. Specifically, a three-input adder has three inputs, each of which may have a maximum value of $1.9999_{10}$. Therefore, the output of each first level adder has a maximum value of $3 \times 1.9999_{10} = 5.9999_{10}$ which requires 3 bits to the left of the binal point in binary representation, or 2 bits of growth over the input level. At the next level, the inputs have a maximum value of $5.9999_{10}$, so with three inputs the maximum output value would be $3\times5.9999_{10}=17.9999_{10}$, which requires 5 bits to the left of the binal point in binary representation, or again 2 bits of growth over the previous level. At the level after that, the inputs have a maximum value of $17.9999_{10}$, so with three inputs the maximum output value would be $3\times17.9999_{10}=53.9999_{10}$, which requires 6 bits to the left of the binal point in binary representation, or in this case only 1 bit of growth over the previous level.

To generalize, then, for a base m, the number of bits at the nth level would be $\text{ceil}(\log_2(m^n))$, meaning that the wordgrowth to the left of the binal point at the nth level, as compared to the (n−1)st level, is $\text{ceil}(\log_2(m^n))-\text{ceil}(\log_2(m^{n-1}))$. And for an n-level tree of adders having a total of M inputs, regardless of base, the total wordgrowth to the left of the binal point over the entire tree would be $\text{ceil}(\log_2 M)-1$.

Figure 7:
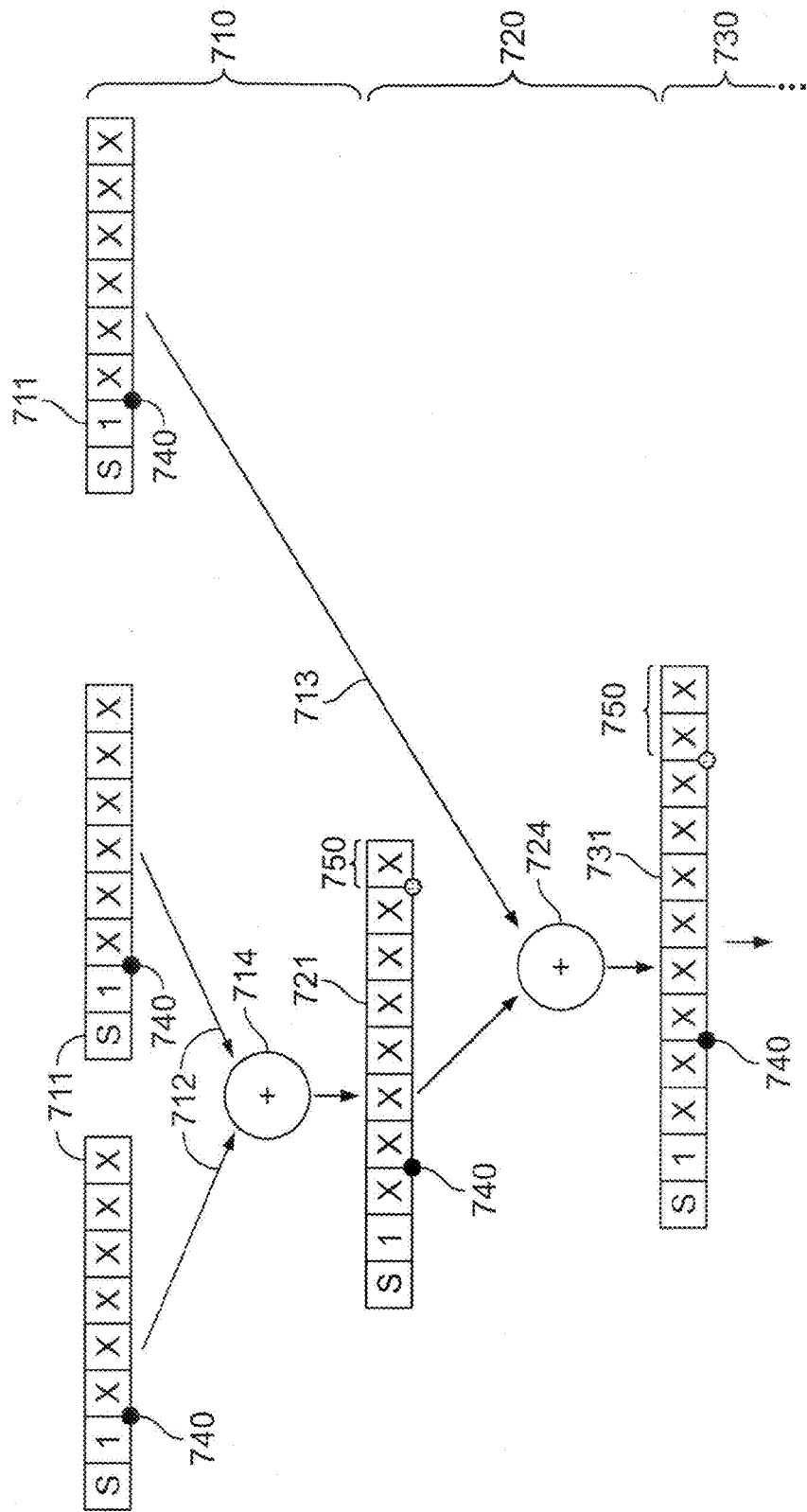
FIG. 7 is a schematic representation of an addition operation illustrating another embodiment of the invention.

Taking the example of binary tree 700 shown in FIG. 7, where there are three inputs 711 in the first level 710, two inputs 712 are added at 714 to yield a result 721 in the second level 720, and the third input 713 is given a "bye" to the second level 720 where it is added at 724 to result 721 to yield result 731 in third level 730. Here, M=3.

In that example, each input 711 has two bits (including one sign bit) to the left of the binal point 740, second level result 721 has three bits to the left of the binal point 740, and third-level result 731 has four bits to the left of the binal point 740, for an increase, for the tree as a whole, of two bits, over the number of bits in the input level. This is expected, insofar as $\text{ceil}(\log_2(3))=\text{ceil}(1.585)=2$.

The foregoing increases in mantissa size to the left of the binal point prevent overflow. On the other hand, increases in mantissa size to the right of the binal point are generally more flexible, based on the user's tolerance for underflow (i.e., tolerance for loss of data as values become so small that they underflow to zero because of insufficient mantissa size to the right of the binal point) or the user's tolerance for bit cancellation (i.e., the loss of data when numbers very close to one another are subtracted). Although underflow could be handled using a "sticky bit" as is common in IEEE754 applications, growth in mantissa size to the right of the binal point might preserve lost data resulting from underflow or bit cancellation. According to this aspect of the invention, because it is a matter of user tolerance, growth in mantissa size to the right of the binal point may be less deterministic than growth to the left of the binal point.

Specifically, any growth 750 to the right of the binal point may be arbitrary as determined by the user, or may be subject to heuristic rules. For example, one bit may be added to the right of the binal point for every n bits added to left of the binal point, optionally subject to a maximum number of added bits.

This aspect of the invention can be implemented with both signed numbers and signed magnitude numbers. The use of signed numbers will make the individual adder/subtractor nodes smaller, and have a lower latency, because a potentially negative number in the fixed-point addition/subtraction portion of the operation will not have to be converted to a positive number and sign bit. If signed numbers are used, more processing may be required to convert between signed magnitude and signed number formats, as well as for some internal functions such as negation or absolute values. However, a common application of this aspect of the invention for large floating point datapaths will likely be dot or inner products, so use of negation or absolute value functions should be infrequent.

As before, the results of any calculation not formatted according to the foregoing standard will be renormalized to meet the standard when necessary to output a value in accordance with the standard, or at intermediate points as discussed above. However, because the mantissa size at each level or step of each calculation need not be the same according to this aspect of the invention, implementation of any user design can be expected to save up to about 15% of resources as compared to the initial aspect of the invention discussed above. For example, to add 16 numbers, a tree of 15 adders may be used. If a 32-bit result is needed and all adders are 32 bits wide, then $15\times32=480$ resource units are needed. However, according to this aspect of the invention, assuming wordgrowth of two bits per node (e.g., one bit on each side of the binal point), the number of resource units needed might be $8\times26=208$ plus $4\times28=112$ plus $2\times30=60$ plus $1\times32=32$ for a total of 412 resource units, which is just under 86% of 480 resource units, for a savings of over 14%.

Although in the foregoing discussion, the only standard referred to is the IEEE754-1985 standard, it should be noted the invention applies regardless of what the standard is, and moreover the output standard may not be the same as the input standard. Moreover, any reference herein, or in the claims that follow, to "input," "output," "initial" or "final" may refer to an intermediate point at which renormalization is performed, as discussed above, rather than to an absolute input or output.

Instructions for carrying out a method according to this invention may be encoded on a machine-readable medium, to be executed by a suitable computer or similar device to implement the method of the invention for programming or configuring PLDs to perform arithmetic operations in accordance with the format describe above. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 8:
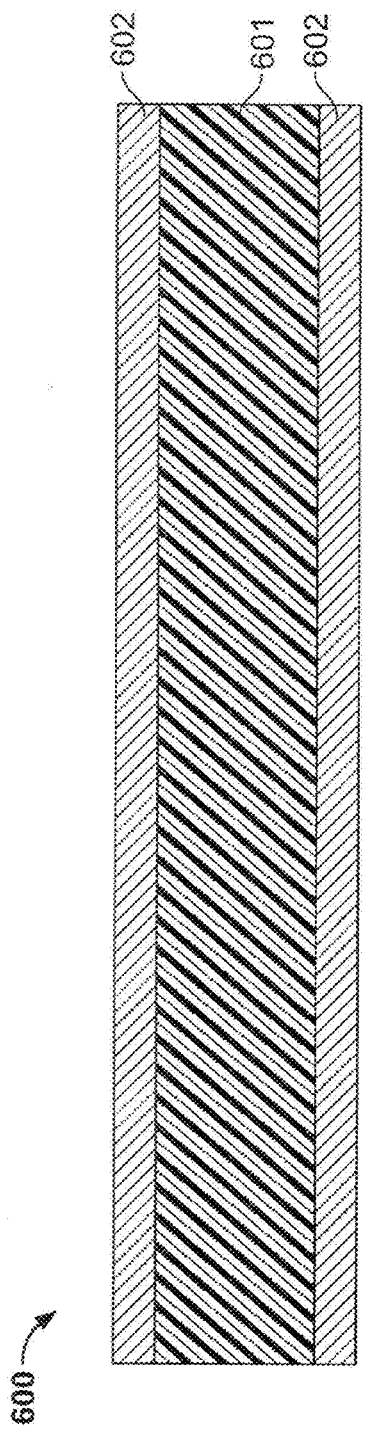
FIG. 8 is a cross-sectional view of a magnetic data storage medium encoded with a set of machine-executable instructions for performing the method according to the present invention.

FIG. 8 presents a cross section of a magnetic data storage medium 600 which can be encoded with a machine executable program that can be carried out by systems such as the aforementioned personal computer, or other computer or similar device. Medium 600 can be a floppy diskette or hard disk, or magnetic tape, having a suitable substrate 601, which may be conventional, and a suitable coating 602, which may be conventional, on one or both sides, containing magnetic domains (not visible) whose polarity or orientation can be altered magnetically. Except in the case where it is magnetic tape, medium 600 may also have an opening (not shown) for receiving the spindle of a disk drive or other data storage device.

The magnetic domains of coating 602 of medium 600 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 9:
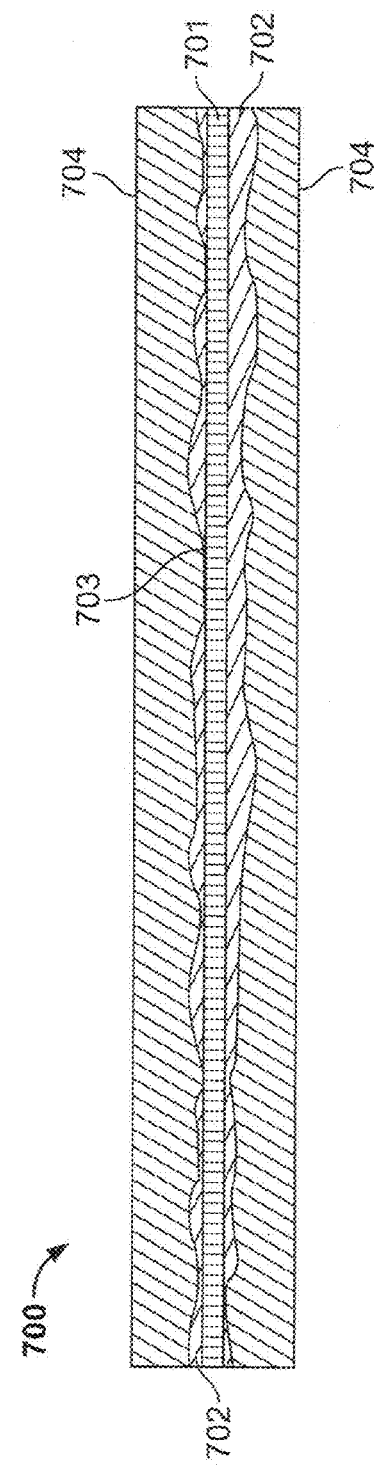
FIG. 9 is a cross-sectional view of an optically readable data storage medium encoded with a set of machine executable instructions for performing the method according to the present invention.

FIG. 9 shows a cross section of an optically-readable data storage medium 700 which also can be encoded with such a machine-executable program, which can be carried out by systems such as the aforementioned personal computer, or other computer or similar device. Medium 700 can be a conventional compact disk read only memory (CD-ROM) or digital video disk read only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 700 preferably has a suitable substrate 701, which may be conventional, and a suitable coating 702, which may be conventional, usually on one or both sides of substrate 701.

In the case of a CD-based or DVD-based medium, as is well known, coating 702 is reflective and is impressed with a plurality of pits 703, arranged on one or more layers, to encode the machine-executable program. The arrangement of pits is read by reflecting laser light off the surface of coating 702. A protective coating 704, which preferably is substantially transparent, is provided on top of coating 702.

In the case of magneto-optical disk, as is well known, coating 702 has no pits 703, but has a plurality of magnetic domains whose polarity or orientation can be changed magnetically when heated above a certain temperature, as by a laser (not shown). The orientation of the domains can be read by measuring the polarization of laser light reflected from coating 702. The arrangement of the domains encodes the program as described above.

Thus it is seen that a method for carrying out floating point operations, a programmable device programmed to perform the method, and software for carrying out the programming, have been provided.

Figure 10:
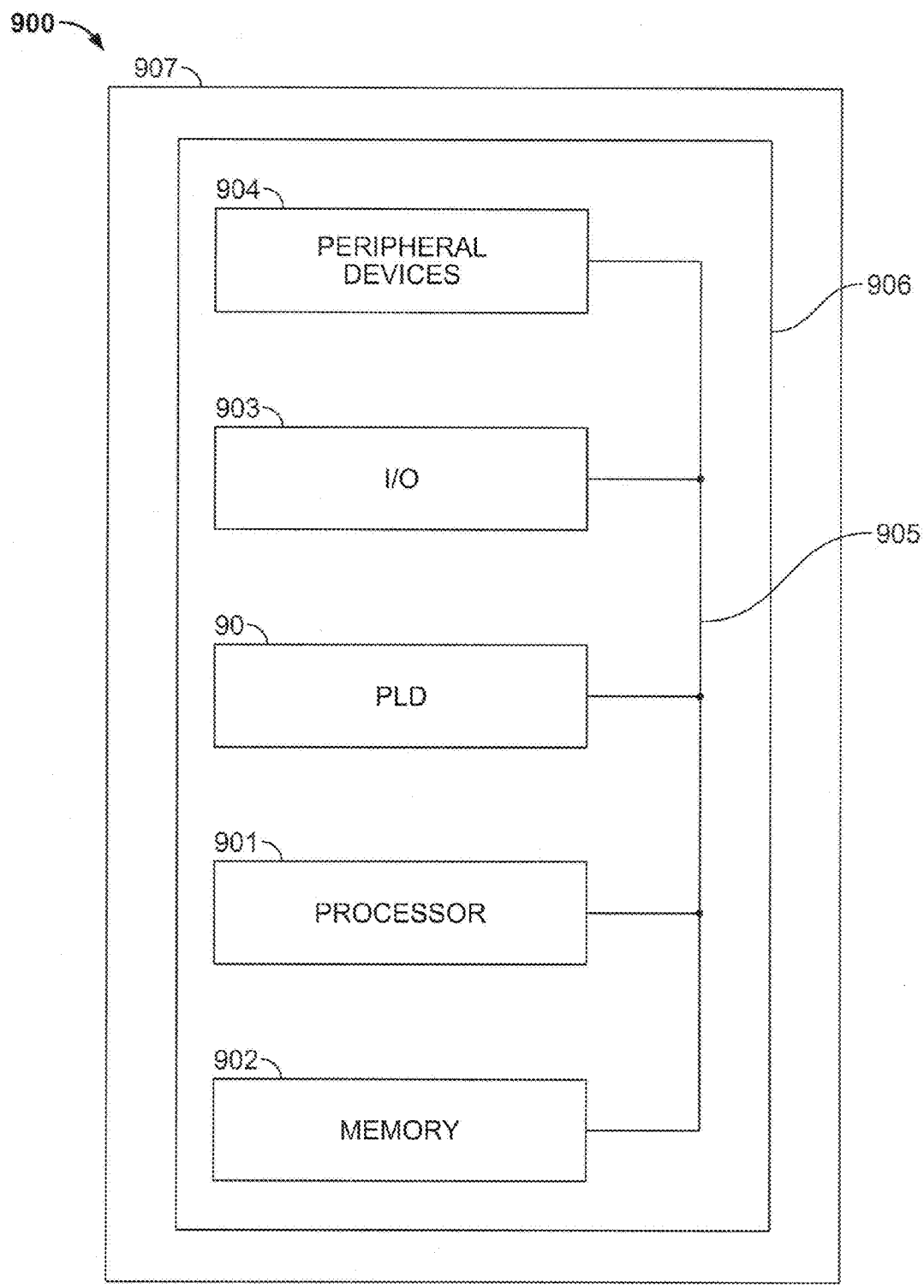
FIG. 10 is a simplified block diagram of an illustrative system employing a programmable device incorporating the present invention.

A programmable device, such as a PLD 90, programmed according to the present invention may be used in many kinds of electronic devices. One possible use is in a data processing system 900 shown in FIG. 10. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement programmable devices, such as PLDs 90, as described above and incorporating this invention.

It will be understood that the foregoing is only illustrative of the principles of the invention, and that various modifications can be made by those skilled in the art without departing from the scope and spirit of the invention. For example, the various elements of this invention can be provided on a programmable device in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring a programmable device to perform floating point operations on input values formatted in accordance with an input standard requiring a first mantissa size and a first exponent size, said method comprising:

configuring logic of said programmable device to reformat said input values to have an initial mantissa size different from said first mantissa size;

configuring logic of said programmable device to perform a tree of successive operations to compute a final result, wherein:

each respective operation in a first level of said tree of successive operations has a first number of said reformatted input values as inputs and provides a respective first intermediate result having a mantissa size increased by at least one bit left of its binal point as compared to said initial mantissa size;

each operation in a respective successive level of said tree of successive operations after said first level of said tree of successive operations, other than a final level, has said first number of inputs and provides a respective intermediate result and said final level provides said final result, and each of said respective intermediate results and said final result is unnormalized and has a mantissa size increased by at least one bit left of its binal point as compared to an intermediate result on an immediately preceding level; and configuring logic of said programmable device to reformat said final result in accordance with an output standard.

2. The method of claim 1 wherein:

said output standard is said input standard; and said configuring logic of said programmable device to reformat said final result comprises configuring said logic of said programmable device to reformat said final result in accordance with said input standard to said first mantissa size.

3. The method of claim 1 wherein each of said input values is in signed number format.

4. The method of claim 1 wherein each of said input values is in signed magnitude format.

5. The method of claim 1 wherein:

said first number is m; and said at least one bit at a level n of said tree equals $\operatorname{ceil}(\log_2(m^n)) - \operatorname{ceil}(\log_2(m^{n-1}))$.

6. The method of claim 1 wherein:

said mantissa size of said final result is increased by a second number of bits left of its binal point as compared to said initial mantissa size; and said second number of bits is equal to $\operatorname{ceil}(\log_2 M)$ where M is a total number of inputs entering said tree.

7. The method of claim 1 wherein:

at least one of said first intermediate result, said respective intermediate results and said final result has a mantissa size increased by one bit right of its binal point 5 as compared to said initial mantissa size.

8. The method of claim 7 wherein:

said first intermediate result has a mantissa size increased by one bit right of its binal point as compared to said initial mantissa size; and each of said respective intermediate results and said final result has a mantissa size increased by one bit right of its binal point as compared to a previous intermediate result.

9. The method of claim 7 wherein, whenever addition of a bit left of the binal point of a result of one of said operations results in the mantissa size of the result of that one of said operations exceeding the initial mantissa size to the left of the binal point by an integer multiple of a predetermined number of bits, and no previous one of said operations has resulted in the mantissa size exceeding the initial mantissa size to the left of the binal point by that integer multiple of the predetermined number of bits, the result of that one of said operations has its mantissa size increased by one bit right of its binal point as compared to an immediately preceding intermediate result.

10. A programmable integrated circuit device configured to perform floating point operations on values formatted in accordance with an input standard requiring a first mantissa size and a first exponent size, said configured programmable integrated circuit device comprising:
   logic circuitry configured to reformat said input values to have an initial mantissa size different from said first mantissa size;
   logic circuitry configured to perform a tree of successive operations to compute a final result, wherein:
   each respective operation in a first level of said tree of successive operations has a first number of said reformatted input values as inputs and provides a respective first intermediate result having a mantissa size increased by at least one bit left of its binal point as compared to said initial mantissa size;
   each operation in a respective successive level of said tree of successive operations after said first level of said tree of successive operations, other than a final level, has said first number of inputs and provides a respective intermediate result and said final level provides said final result, and
   each of said respective intermediate results and said final result is unnormalized and has a mantissa size increased by at least one bit left of its binal point as compared to an intermediate result on an immediately preceding level; and
   logic circuitry configured to reformat said final result in accordance with said standard to said first mantissa size configuring logic of said programmable device to reformat said final result in accordance with an output standard.

11. The configured programmable integrated circuit device of claim 10 wherein:
   said output standard is said input standard; and
   said logic circuitry configured to reformat said final result comprises logic configured to reformat said final result in accordance with said input standard to said first mantissa size.

12. The configured programmable integrated circuit device of claim 10 wherein:
   said first number is m; and
   said at least one bit at a level n of said tree equals $\text{ceil}(\log_2(m^n)) - \text{ceil}(\log_2(m^{n-1}))$.

13. The configured programmable integrated circuit device of claim 10 wherein:
   said mantissa size of said final result is increased by a second number of bits left of its binal point as compared to said initial mantissa size; and
   said second number of bits is equal to $\text{ceil}(\log_2 M)$ where M is a total number of inputs entering said tree.

14. The configured programmable integrated circuit device of claim 10 wherein said logic circuitry is configured to increase the mantissa size of at least one of said first intermediate result, said respective intermediate results and said final result by at least one bit right of its binal point as compared to said initial mantissa size.

15. The configured programmable integrated circuit device of claim 14 wherein:
   said first intermediate result has a mantissa size increased by at least one bit right of its binal point as compared to said initial mantissa size; and
   each of said respective intermediate results and said final result has a mantissa size increased by one bit right of its binal point as compared to an immediately preceding intermediate result.

16. The configured programmable integrated circuit device of claim 14 wherein, whenever addition of a bit left of the binal point of a result of one of said operations results in the mantissa size of the result of that one of said operations exceeding the initial mantissa size to the left of the binal point by an integer multiple of a predetermined number of bits, and no previous one of said operations has resulted in the mantissa size exceeding the initial mantissa size to the left of the binal point by that integer multiple of the predetermined number of bits, the result of that one of said operations has its mantissa size increased by one bit right of its binal point as compared to an immediately preceding intermediate result.

17. A non-transitory machine-readable data storage medium encoded with machine-executable instructions for configuring a programmable device to execute a method of performing floating point operations on values formatted in accordance with an input standard requiring a first mantissa size and a first exponent size, said instructions comprising:
   instructions to configure logic of said programmable device to reformat said input values to have an initial mantissa size different from said first mantissa size;
   instructions to configure logic of said programmable device to perform a tree of successive operations to compute a final result, wherein:
   each respective operation in a first level of said tree of successive operations has a first number of said reformatted input values as inputs and provides a respective first intermediate result having a mantissa size increased by at least one bit left of its binal point as compared to said initial mantissa size;
   each operation in a respective successive level of said tree of successive operations after said first level of said tree of successive operations, other than a final level, has said number of inputs and provides a respective intermediate result and said final level provides said final result, and
   each of said respective intermediate results and said final result is unnormalized and has a mantissa size increased by at least one bit left of its binal point as compared to an intermediate result on an immediately preceding level; and
   instructions to configure logic of said programmable device to reformat said final result in accordance with an output standard.

18. The non-transitory machine-readable data storage medium of claim 17 wherein:
   said output standard is said input standard; and
   instructions to configure logic of said programmable device to reformat said final result comprise instructions to configure said logic of said programmable device to reformat said final result in accordance with said input standard to said first mantissa size.

19. The non-transitory machine-readable data storage medium of claim 17 wherein:
   said first number is m; and
   said at least one bit at a level n of said tree equals $\text{ceil}(\log_2(m^n)) - \text{ceil}(\log_2(m^{n-1}))$.

20. The non-transitory machine-readable data storage medium of claim 17 wherein:
   said mantissa size of said final result is increased by a second number of bits left of its binal point as compared to said initial mantissa size; and
   said second number of bits is equal to $\text{ceil}(\log_2 M)$ where M is a total number of inputs entering said tree.

21. The non-transistory machine-readable data storage medium of claim 17 wherein said instructions configure said logic to increase the mantissa size of at least one of first intermediate result, said respective intermediate results and said final result by one bit right of its binal point as compared to said initial mantissa size.

22. The non-transistory machine-readable data storage medium of claim 21 wherein said instructions configure said logic to:
increase said mantissa size of said first intermediate result by one bit right of its binal point as compared to said initial mantissa size; and
increase said mantissa size of each of said respective intermediate results and said final result by one bit right of its binal point as compared to a previous intermediate result.

23. The non-transistory machine-readable data storage medium of claim 21 wherein said instructions configure said logic to, whenever addition of a bit left of the binal point of a result of one of said operations results in the mantissa size of the result of that one of said operations exceeding the initial mantissa size to the left of the binal point by an integer multiple of a predetermined number of bits, and no previous one of said operations has resulted in the mantissa size exceeding the initial mantissa size to the left of the binal point by that integer multiple of the predetermined number of bits, increase the mantissa size of the result of that one of said operations increased by one bit right of its binal point as compared to a previous intermediate result.

\* \* \* \* \*